(12) United States Patent
Sestok, IV et al.

(10) Patent No.: US 12,411,463 B2
(45) Date of Patent: Sep. 9, 2025

(54) MEASUREMENT CIRCUIT HAVING FREQUENCY DOMAIN ESTIMATION OF DEVICE UNDER TEST (DUT) MODEL PARAMETERS

(71) Applicant: TEXAS INSTRUMENTS INCORPORATED, Dallas, TX (US)

(72) Inventors: Charles Kasimer Sestok, IV, Dallas, TX (US); David Patrick Magee, Allen, TX (US); Yevgen Pavlovich Barsukov, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/532,970

(22) Filed: Nov. 22, 2021

(65) Prior Publication Data
US 2022/0163590 A1 May 26, 2022

Related U.S. Application Data

(60) Provisional application No. 63/118,386, filed on Nov. 25, 2020.

(51) Int. Cl.
*G05B 13/04* (2006.01)
*G01R 31/367* (2019.01)
(Continued)

(52) U.S. Cl.
CPC ......... *G05B 13/042* (2013.01); *G01R 31/367* (2019.01); *G01R 31/3842* (2019.01);
(Continued)

(58) Field of Classification Search
CPC .............. G01R 31/367; G01R 31/3842; G01R 31/389; G06F 17/14; G06F 17/18
See application file for complete search history.

(56) References Cited

U.S. PATENT DOCUMENTS

| 10,191,098 B2 | 1/2019 | Beer | |
| 2009/0096459 A1* | 4/2009 | Yoneda | G01R 31/367 324/430 |

(Continued)

FOREIGN PATENT DOCUMENTS

| CN | 109472079 A | * | 3/2019 | ............. G06F 30/20 |
| CN | 110794319 A | * | 2/2020 | |

(Continued)

OTHER PUBLICATIONS

Machine translation of CN111337843A, downloaded Jan. 2023 (Year: 2023).*

(Continued)

*Primary Examiner* — John C Kuan
(74) *Attorney, Agent, or Firm* — Charles F. Koch; Frank D. Cimino

(57) ABSTRACT

A circuit for determining device under test (DUT) model parameters is described. The circuit includes a parameter estimator circuit configured to: obtain initial values for DUT model parameters based on sense signal samples; execute a parameter convergence model having a regularization parameter and a cost function that accounts for error residuals; and obtain final values for the DUT model parameters by adjusting the regularization parameter in iterations of the parameter convergence model as a function of cost function improvement until the parameter convergence model converges to within a target tolerance.

23 Claims, 7 Drawing Sheets

(51) Int. Cl.
    *G01R 31/3842*     (2019.01)
    *G01R 31/389*     (2019.01)
    *G06F 17/11*     (2006.01)
    *G06F 17/14*     (2006.01)
    *G06F 17/18*     (2006.01)
    *G06F 17/13*     (2006.01)
    *G06F 17/16*     (2006.01)

(52) U.S. Cl.
    CPC ............ *G01R 31/389* (2019.01); *G06F 17/11* (2013.01); *G05B 13/04* (2013.01); *G06F 17/13* (2013.01); *G06F 17/14* (2013.01); *G06F 17/16* (2013.01); *G06F 17/18* (2013.01)

(56) References Cited

U.S. PATENT DOCUMENTS

| | | | |
|---|---|---|---|
| 2013/0185008 A1* | 7/2013 | Itabashi | G01R 31/389 702/63 |
| 2015/0084576 A1 | 3/2015 | Magee | |
| 2020/0313656 A1* | 10/2020 | Gao | G06N 3/08 |
| 2023/0122362 A1* | 4/2023 | Shoa Hassani Lashidani | G01R 31/392 702/63 |

FOREIGN PATENT DOCUMENTS

| | | | | |
|---|---|---|---|---|
| CN | 111337843 A | * | 6/2020 | ........... G01R 31/385 |
| EP | 0525124 B1 | | 3/2003 | |

OTHER PUBLICATIONS

Mack, "Machine learning fundamentals (I): Cost functions and gradient descent" Towards Data Science, Nov. 27, 2017 (Year: 2017).*

Eigenmann et al., "Gradient Based Adaptive Regularization" 1999 IEEE (Year: 1999).*

Guha et al., "Online Estimation of the Electrochemical Impedance Spectrum and Remaining Useful Life of Lithium-Ion Batteries" IEEE Transactions on Instrumentation and Measurement, vol. 67, No. 8, Aug. 2018 (Year: 2018).*

Search Report for PCT Patent Application No. PCT/US2021/060562 date of mailing of the international search report Feb. 17, 2022, 1 page.

* cited by examiner

MEASUREMENT CIRCUIT HAVING FREQUENCY DOMAIN ESTIMATION OF DEVICE UNDER TEST (DUT) MODEL PARAMETERS

CROSS-REFERENCE TO RELATED APPLICATION

This application claims priority to U.S. Provisional Application No. 63/118,386, filed Nov. 25, 2020, which is hereby incorporated by reference.

BACKGROUND

As new electronic devices are developed and integrated circuit (IC) technology advances, new IC products are commercialized. One example IC product for electronic devices is a microcontroller or measurement circuit configured to obtain measurements of a device under test (DUT), analyze the measurements to determine at least one parameter, and provide the parameter or related control signals for DUT management operations.

Many electronic systems include a battery unit and a related monitoring circuit. In such systems, the battery unit is an example of a DUT and the monitoring circuit includes a microcontroller or measurement circuit configured to obtain voltage and current measurements related to each battery unit. The voltage and current measurements may be used to determine a parameter such as battery unit impedance. The determined battery unit impedance and/or other parameters are used for battery management operations. Example battery management operations include battery unit charging operations, battery unit status management, and battery unit health monitoring.

In some systems, DUT management involves estimating DUT model parameters in the frequency domain, where the DUT model parameters are based on an equivalent circuit model for the DUT. However, estimating DUT model parameters for varying conditions (e.g. different ICs, temperatures, current flow, and/or DUT age) is problematic. An existing technique relies on a non-linear least squares algorithm to estimate DUT model parameters in the frequency domain. Convergence of DUT model parameters using the non-linear least squares algorithm is time-consuming and/or the results are inaccurate for different conditions.

SUMMARY

In one example embodiment, a circuit for estimating device under test (DUT) model parameters is described. The circuit comprises a parameter estimator circuit configured to: obtain initial values for DUT model parameters based on sense signal samples; execute a parameter convergence model having a regularization parameter and a cost function that accounts for error residuals; and obtain final values for the DUT model parameters by adjusting the regularization parameter in iterations of the parameter convergence model as a function of cost function improvement until the parameter convergence model converges to within a target tolerance.

In another example embodiment, a system comprises sense circuitry adapted to be coupled to a device under test (DUT) and configured to obtain sense signal samples related to the DUT in response to an excitation signal. The system also comprises a measurement circuit coupled to the sense circuity. The measurement circuit is configured to: obtain initial values for DUT model parameters based on the obtained sense signal samples; execute a parameter convergence model having a regularization parameter and a cost function that accounts for error residuals; and obtain final values for the DUT model parameters by adjusting the regularization parameter in iterations of the parameter convergence model as a function of cost function improvement until the parameter convergence model converges to within a target tolerance.

In yet another example embodiment, a method for DUT management is described. The method comprises: obtaining, by a measurement circuit, sense signal samples related to the DUT; obtaining, by the measurement circuit, initial values for DUT model parameters as a function of frequency based on the obtained sense signal samples; executing, by the measurement circuit, a parameter convergence model having a regularization parameter and a cost function that accounts for error residuals; obtaining, by the measurement circuit, final values for the DUT model parameters by adjusting the regularization parameter in iterations of the parameter convergence model as a function of cost function improvement until the parameter convergence model converges to within a target tolerance; and using the DUT model parameters to perform DUT management operations.

DETAILED DESCRIPTION

Figure 1:
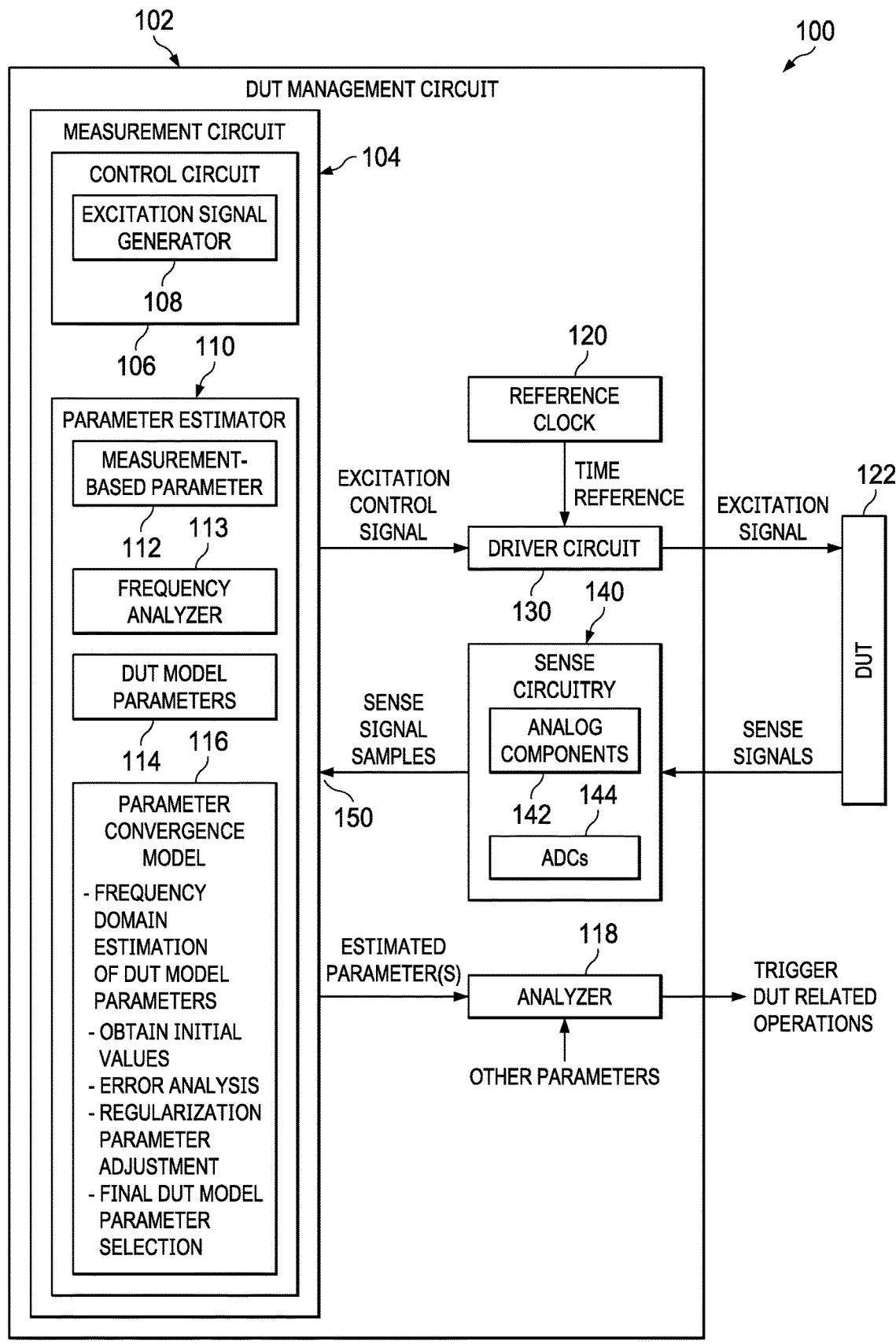
FIG. 1 is a block diagram of a system in accordance with an example embodiment.

The same reference numbers (or other reference designators) are used in the drawings to designate the same or similar (structurally and/or functionally) features. FIG. 1 is a block diagram of a system 100 in accordance with an example embodiment. The system 100 represents an electric vehicle, a desktop computer, a laptop computer, a smartphone, or other electrical system. As shown, the system 100 includes a device under test (DUT) 122 coupled to a DUT management circuit 102. The DUT management circuit 102 includes a control circuit 106 and a parameter estimator circuit 110. In some example embodiments, the control circuit 106 includes an excitation signal generator 108 configured to generate an excitation control signal. The excitation signal generator 108 provides the excitation control signal to a driver circuit 130, which is configured to generate an excitation signal based on the excitation control signal and a time reference from a reference clock 120. In some example embodiments, the driver circuit 130 and/or another excitation signal source is external to the DUT management circuit 102. In either case, the excitation signal generated by the driver circuit 130 is provided to the DUT 122 and results in sense signals from the DUT 122. The sense signals from the DUT 122 are input to sense circuitry 140 coupled to the DUT 122. The sense circuitry 140 samples the sense signals using analog components 142 (e.g., sense resistors, amplifier circuitry, filter circuitry, anti-aliasing circuitry, etc.) and analog-to-digital converters (ADCs) 144. The sense signal samples resulting from the operations of the sense circuitry 140 are provided from the sense circuitry 140 to a sense signal input 150 of the measurement circuit 104. The sense signal samples are used, for example, by the parameter estimator circuit 110.

In some example embodiments, the DUT management circuit 102 is an integrated circuit (IC). In other example embodiments, the DUT management circuit 102 includes multiple ICs and/or discrete components packaged together or mounted to a printed circuit board (PCB). In one example, the measurement circuit 104 may be in a first IC, while the reference clock 120, driver circuit 130, and sense circuitry 140 are in a second IC.

In different example embodiments, the parameter estimator circuit 110 may include a processor, a coprocessor, a logic accelerator, or other logic unit configured to perform frequency domain estimation of DUT model parameters. In some example embodiments, the parameter estimator circuit 110 may also include memory (e.g., random-access memory, flash memory, or other memory) with related instructions and/or storage for initial values, iteration results, and final values of a parameter convergence model 116. The parameter convergence model 116 is a model or algorithm that is iteratively executed by the measurement circuit 110 until DUT model parameters converge. The parameter estimator circuit 110 may also include a frequency analyzer circuit 113. In some example embodiments, the frequency analyzer circuit 113 is configured to: convert sense signal samples, including voltage sense signal samples and current sense signal samples, to frequency domain values; and represent the frequency domain values as complex values. In some example embodiments, the frequency analyzer circuit 113 performs discrete Fourier transform (DFT) operations from which the frequency domain values and related complex values are obtained. The frequency analyzer circuit 113 is configured to provide the complex values to the parameter convergence model 116. The measurement circuit 104 may also include a user interface and/or communication interface (not shown) to facilitate the measurement circuit 104 obtaining instructions, a predetermined characterization of the DUT 122, and/or other information.

In the example of FIG. 1, the parameter estimator circuit 110 obtains (e.g., stores in memory) a measurement-based parameter 112 derived based on the sense signal samples input to the sense signal input 150. In some example embodiments, the measurement-based parameter 112 is the impedance of the DUT 122 as a function of frequency. Without limitation, the impedance of the DUT 122 as a function of frequency is determined by the measurement circuit 104 from sense signal samples (e.g., samples of the voltage across the DUT 122 and samples of the current through the DUT 122) resulting from application of the excitation signal to the DUT 122. In the example of FIG. 1, the parameter estimator circuit 110 also includes DUT model parameters 114. In some example embodiments, initial values of the DUT model parameters 114 are obtained by the parameter estimator circuit 110 based on the measurement-based parameter 112 and a predetermined characterization of the DUT 122. In some example embodiments, the DUT model parameters 114 include: a series resistance, a series capacitance, a series inductance, mode capacitors, mode resistors, and mode time constants. The mode time constants may vary to account for varying conditions of the DUT such as degree of discharge, temperature condition, and age.

In some example embodiments, the measurement circuit 104 uses the parameter estimator circuit 110 to perform frequency domain of DUT model parameters. Example operations of the measurement circuit 104 (or the parameter estimator circuit 110) include: obtain sense signal samples related to the DUT 122 (e.g., indicating voltage across the DUT 122 and/or current through the DUT 122); obtain initial values for the DUT model parameters 114 based on the obtained sense signals; perform error analysis using the parameter convergence model 116; iteratively adjust a regularization parameter of the parameter convergence model 116 based on the error analysis; and select final values of the DUT model parameters 114 when the parameter convergence model 116 converges to within a target tolerance. In some example embodiments, the measurement circuit 104 is configured to: run the parameter convergence model 116 for multiple initial DUT model parameter settings based on a characterization of the DUT 122; and select final converged values for the DUT model parameters 114 based on minimization of a total residual error metric.

In some example embodiments, the parameter estimator circuit 110 is configured to adjust the regularization parameter in iterations of the parameter convergence model 116 as a function of a ratio of cost function improvement to expected improvement. For example, the parameter estimator circuit 110 may be configured to compare the ratio to a threshold. The regularization parameter is then adjusted by the parameter estimator circuit 110 based on the comparison. If the ratio is greater than the threshold, the parameter estimator circuit 110 is configured to select the regularization parameter to be a maximum of a first value and a second value. Without limitation, the first value may be fixed and the second value may be a function of the ratio. If the ratio is less than or equal to the threshold, the parameter estimator circuit 110 is configured to increase the regularization parameter for a next iteration of the parameter convergence model 116 relative to its current value. The final values for the DUT model parameters 114 may be provided by the parameter estimator circuit 110 to an analyzer circuit 118, which is configured to direct or trigger DUT management operations based on the DUT model parameters 114 and possibly other parameters.

In some example embodiments, the analyzer circuit 118 is a processor, application-specific integrated circuit (ASIC), or programmable logic. The analyzer circuit 118 may use the DUT model parameters and possibly other parameters (e.g., temperature or other conditions) to trigger DUT-related operations. Example DUT-related operations triggered by the analyzer circuit 118 (e.g., when the DUT is a battery unit) include: adjusting battery unit charging operations (turn battery unit charging on/off), updating a battery unit charge indicator status (e.g., 30%, 50%, 70%, 90%, etc.); identifying a battery unit fault condition; and/or other battery management operations.

Figure 2:
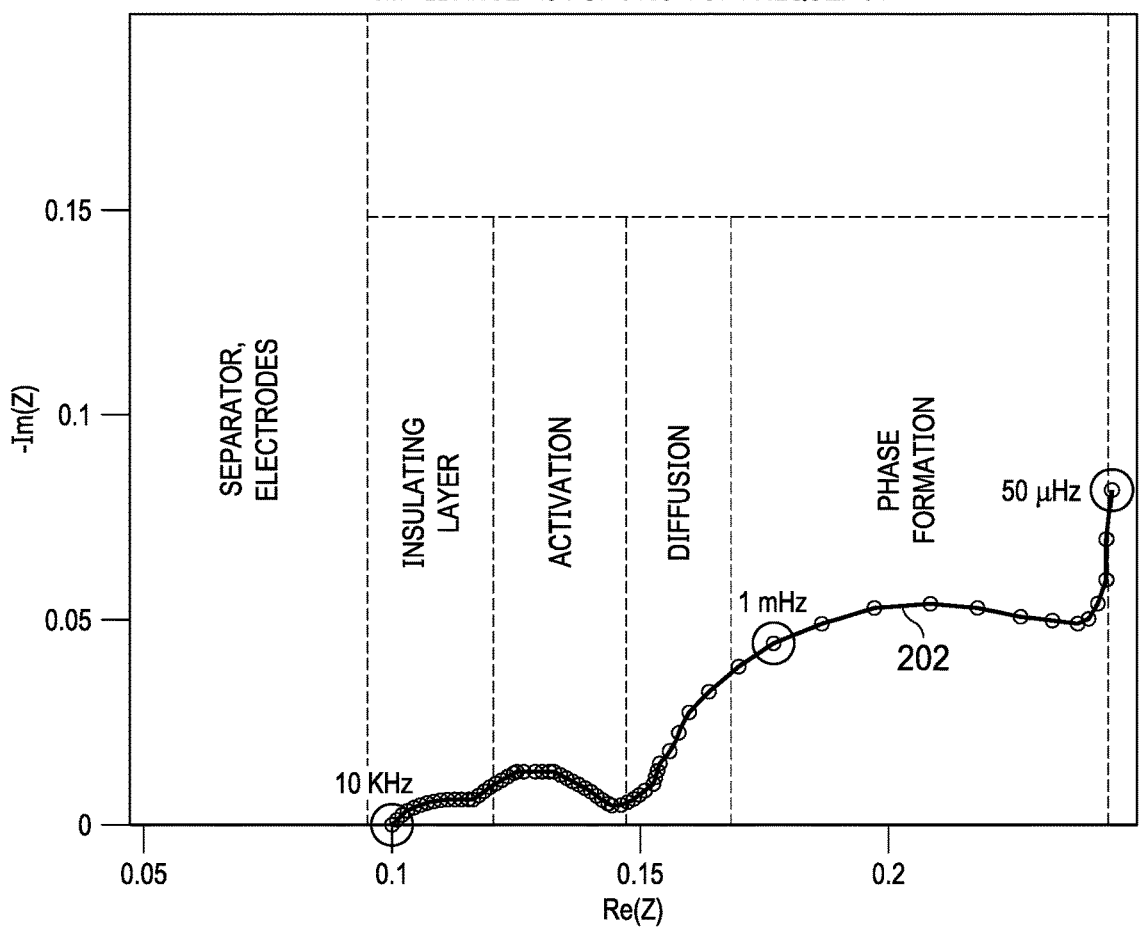
FIG. 2 is a diagram of battery unit impedance as a function of frequency in accordance with an example embodiment.

FIG. 2 is a diagram 200 of battery unit impedance as a function of frequency in accordance with an example embodiment. In the diagram 200, imaginary impedance versus real impedance of a battery unit are represented as a function of frequency. The diagram 200 also shows different battery unit features (e.g., separator, electrodes, insulating layer, activation, diffusion, electronic conduction, ionic conduction, and phase formation) related to the impedance variations. The plotted curve 202 in diagram 200 represents the impedance as a function of frequency for a particular battery unit. When impedance as a function of frequency for a battery unit is modeled accurately (e.g., using an equivalent circuit model and related values), the performance and timing of various battery management operations is improved.

Figure 3A:
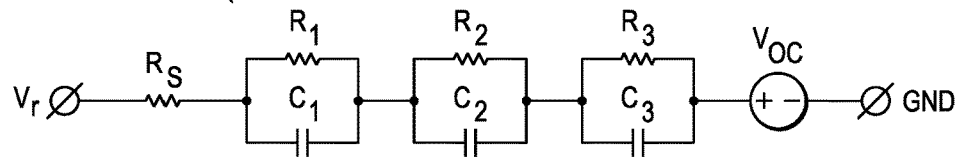
FIG. 3A is a diagram of a battery unit impedance model as a function of frequency in accordance with an example embodiment.

FIG. 3A is a diagram of a battery unit equivalent circuit 300 in accordance with an example embodiment. As shown, the battery unit equivalent circuit 300 models a battery unit as various components between a reference voltage ($V_r$) at the positive terminal of the battery unit and ground. The battery unit model components including a series resistor ($R_s$), a first mode circuit (having $R_1$ and $C_1$), a second mode circuit (having $R_2$ and $C_2$), a third mode circuit (having $R_3$ and $C_2$), and an open circuit voltage (Voc) in series between the V-terminal and ground.

Figure 3B:
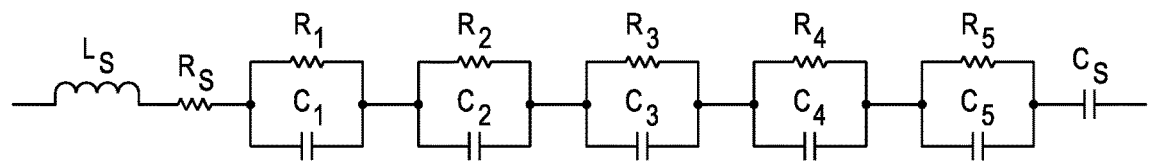
FIG. 3B is a diagram of another battery unit impedance model as a function of frequency in accordance with an example embodiment.

FIG. 3B is a diagram of another battery unit equivalent circuit 310 in accordance with an example embodiment. As shown, the battery unit equivalent circuit 310 models a battery unit as various components in series including: a series inductor ($L_s$); a series resistor ($R_s$); a first mode circuit (having $R_1$ and $C_1$); a second mode circuit (having $R_2$ and $C_2$); a third mode circuit (having $R_3$ and $C_3$); a fourth mode circuit (having $R_4$ and $C_4$); a fifth mode circuit (having $R_5$ and $C_5$); and a series capacitor ($C_s$) to represent Voc. Other battery unit equivalent circuits or models are possible. For example, the number of mode circuits and the values of the model components may vary, which affects the impedance at different frequencies.

Figure 4A:
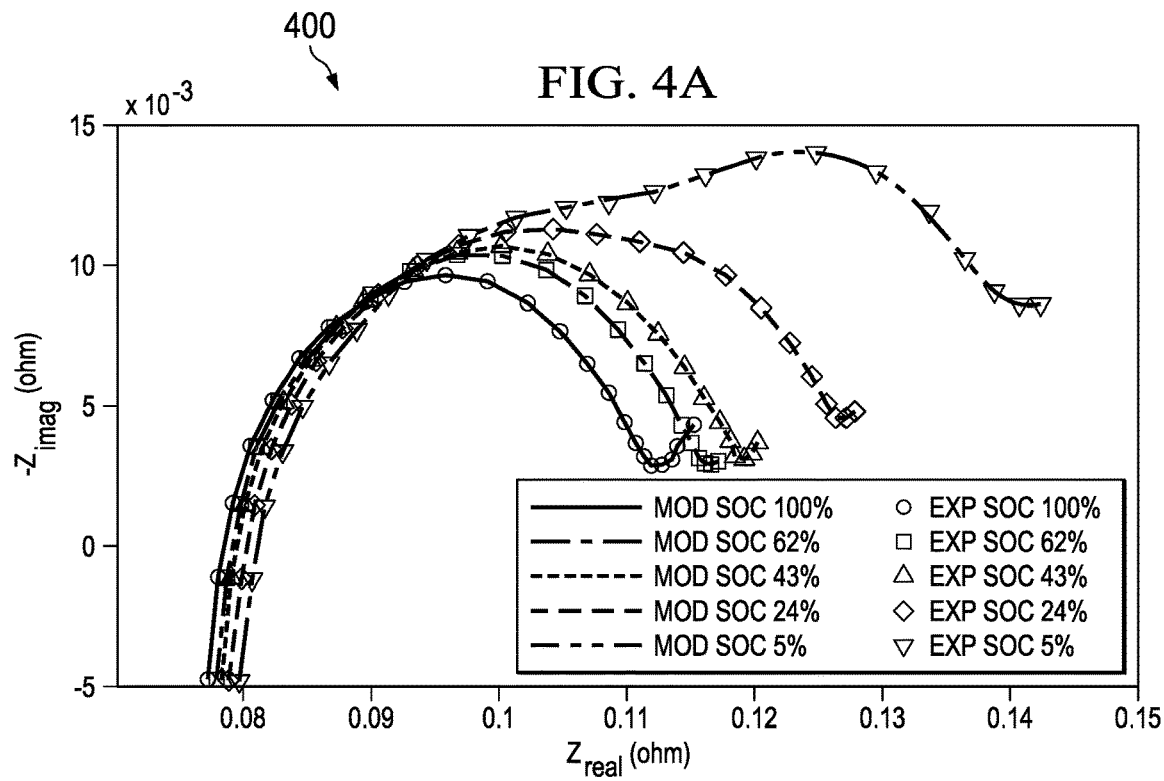
FIG. 4A is a graph of imaginary versus real impedance of a battery unit for different state of charge (SOC) values in accordance with an example embodiment.

FIG. 4A is a graph 400 of imaginary versus real impedance for different battery unit state of charge (SOC) values in accordance with an example embodiment. In graph 400, imaginary and real impedances for different battery unit SOC values are shown. The example battery unit SOC values range from 100% to 5% for the modeled SOC (mod SOC) and the experimental SOC (exp SOC). In some example embodiments, the battery unit SOC is accounted for when estimating DUT model parameters as described herein.

Figure 4B:
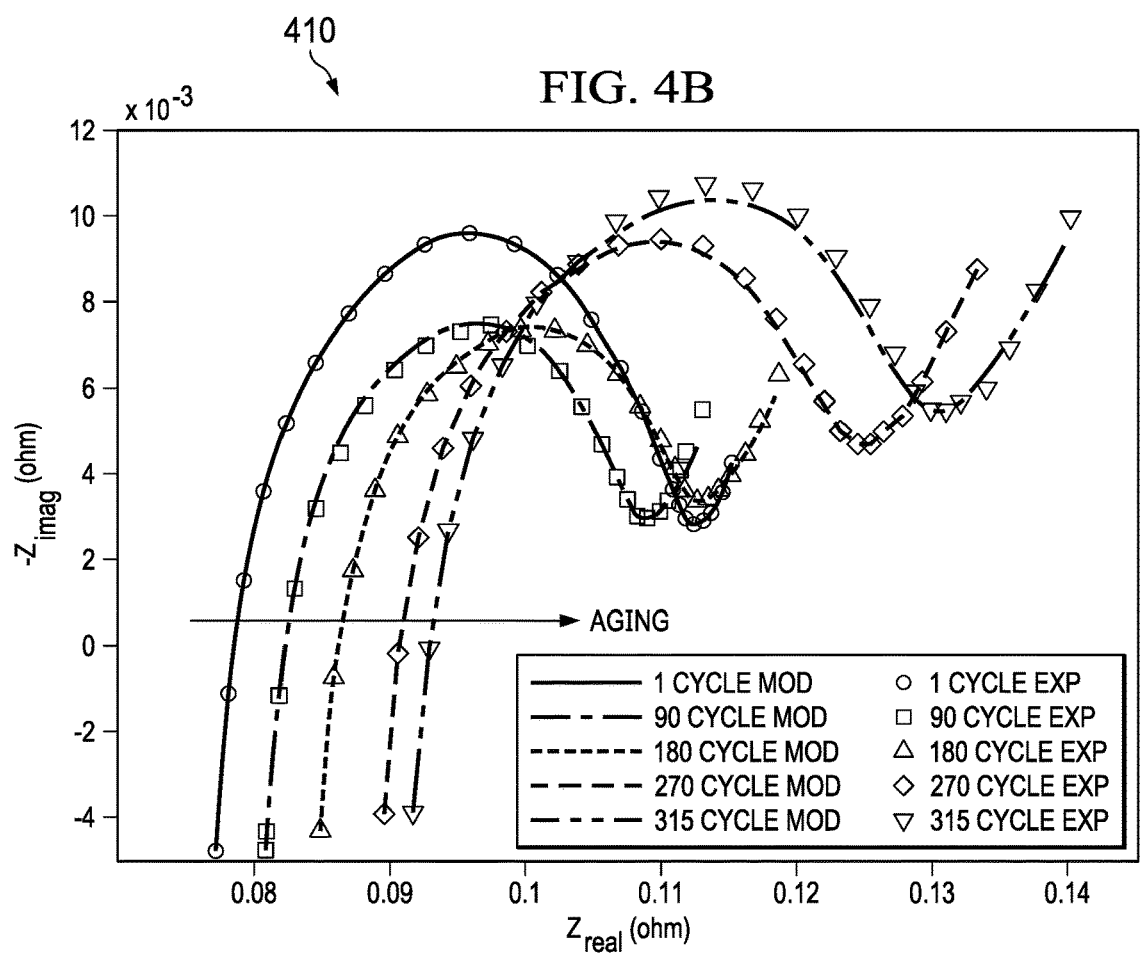
FIG. 4B is a graph of imaginary versus real impedance of a battery unit for different state of health (SOH) values in accordance with an example embodiment.

FIG. 4B is a graph 410 of imaginary versus real impedance for different battery unit state of health (SOH) values in accordance with an example embodiment. In graph 410, imaginary and real impedances for different battery unit SOH values are shown. The example battery unit state of health values are based on charge cycles, which range from 1 cycle to 315 cycles in the example of FIG. 4B. In some example embodiments, the battery unit state of health is accounted for when estimating DUT model parameters as described herein.

Figure 5:
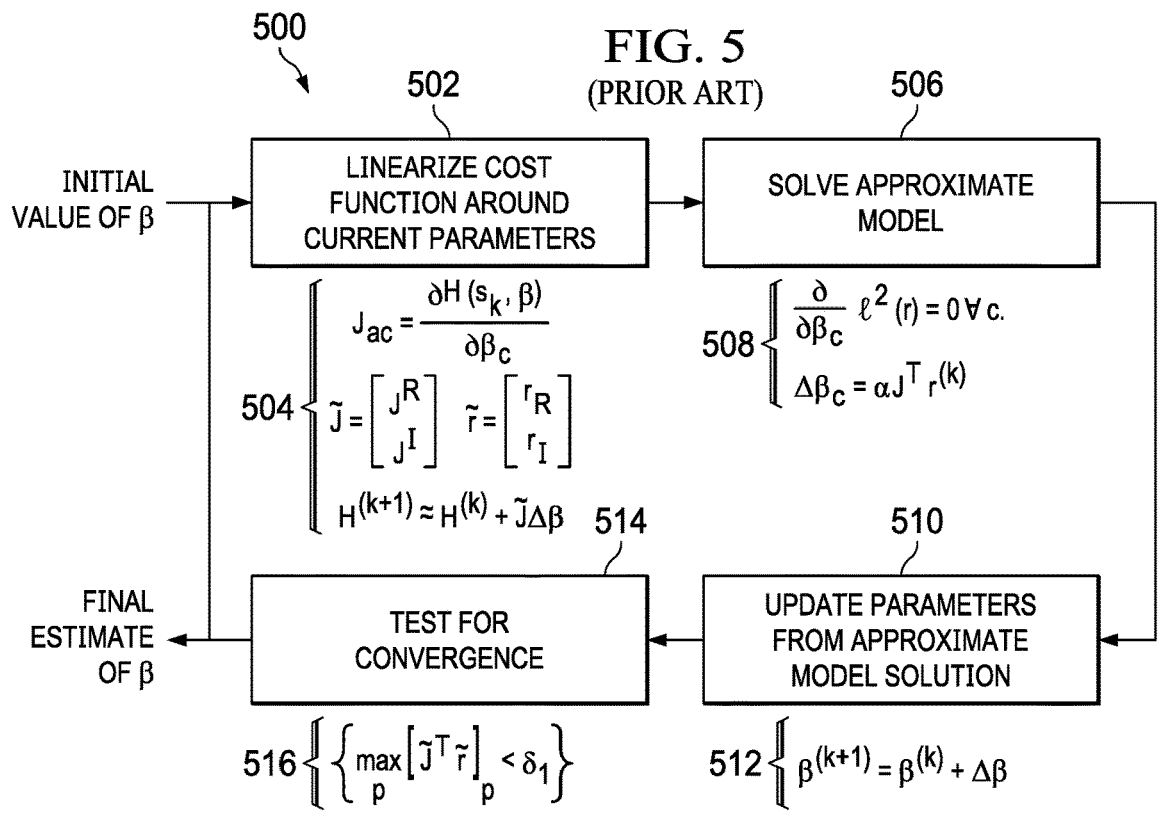
FIG. 5 is a block diagram of a non-linear least squares algorithm to determine device under test (DUT) model parameters in accordance with a conventional technique.

FIG. 5 is a block diagram of a non-linear least squares algorithm 500 to determine DUT model parameters in accordance with a conventional technique. For the example of FIG. 5, $\beta = \{R_s, L, C_s, R_1, R_2, R_3, \ldots, C_1, C_2, C_3, \ldots\}$. Also, the transfer function model of the impedance as a function of the Laplace domain variable s is given as:

$$Z_{TH}(s) = R_s + Ls + \frac{1}{C_s s} + \frac{R_1}{R_1 C_1 s + 1} + \frac{R_2}{R_2 C_2 s + 1} + \frac{R_3}{R_3 C_3 s + 1} + \ldots, \quad \text{Equation (1)}$$

where $R_s$, $L_s$, $C_s$, $R_1$, $R_2$, $R_3$, $C_1$, $C_2$, $C_3$ are example DUT model parameters (see e.g., the DUT model of FIG. 3B). $Z_m(f_n)$ is the measured impedance spectrum, where the variable $f_n$ denotes the measurement frequency for the $n^{th}$ element of the transfer function. Also, the residual r[n, $\beta$], in which is a function of n and $\beta$, is given as:

$$r[n,\beta] = Z_m(f_n) - Z_{TH}(f_n,\beta), \quad \text{Equation (2)}$$

denotes the difference between the model and the measurement. Also, r can be written as a vector:

$$r = [r[1,\beta] \ldots r[N,\beta]]^T, \quad \text{Equation (3)}$$

where N is the number of samples in the measurements.

With the non-linear least squares algorithm 500, an initial value for a set of DUT model parameters ($\beta$) is provided to block 502, which linearizes a cost function around current parameters as represented by equations 504. At block 506, the approximate model is solved as represented by equations 508. At block 510, the DUT model parameters are updated from the approximate model solution as represented by equation 512. At block 514, a test for convergence is performed as represented by equation 516. The operations of blocks 502, 506, 510, 514 are repeated until the final estimate for $\beta$ is within a target tolerance.

The accuracy of the non-linear least squares algorithm 500 and/or the speed of convergence may suffer depending on the initial value for $\beta$ and variable conditions for a DUT (e.g., the DUT 122 in FIG. 1). For example, the non-linear least squares algorithm 500 converges rapidly only when the parameter vector (e.g., $\beta$) is close to a local optimum. Far from a local optimum, a steepest descent technique (e.g., $\Delta\beta = \alpha J^T r^{(k)}$) would reduce the error criterion faster.

Figure 6:
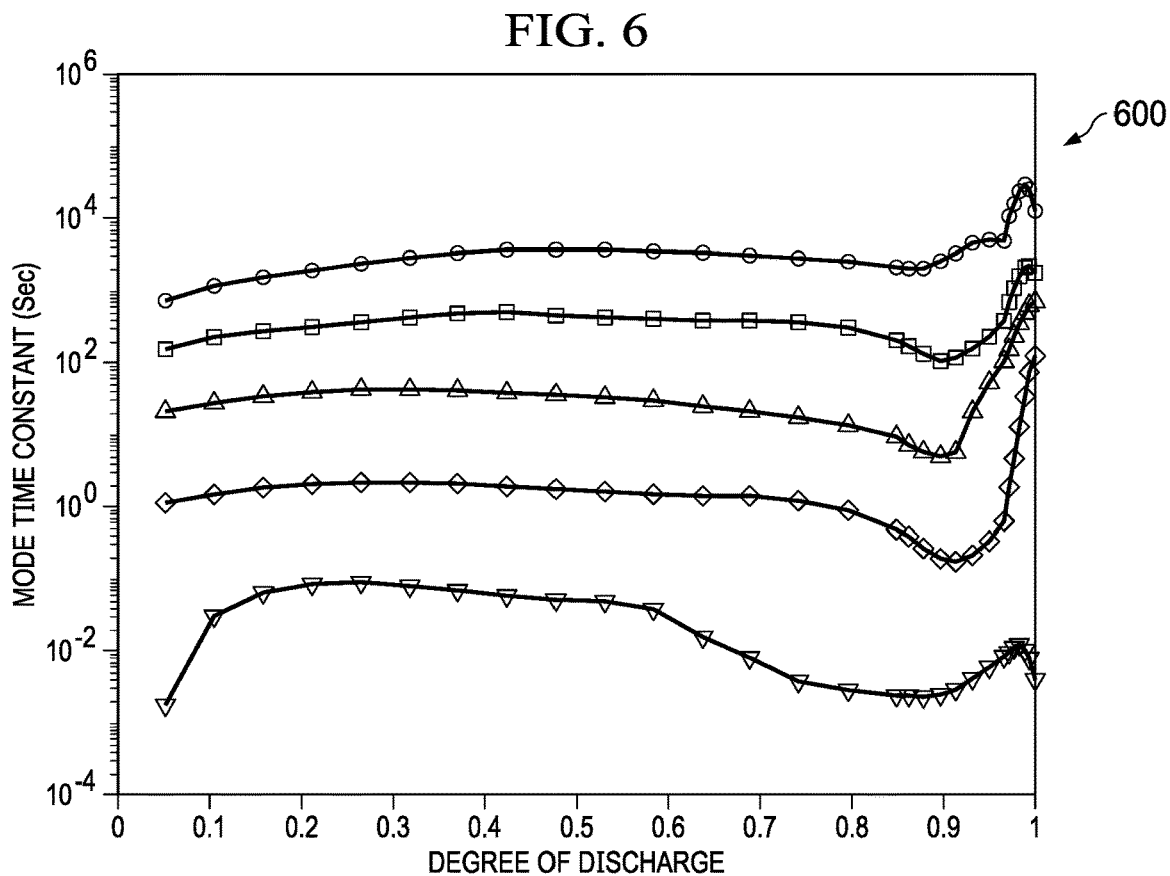
FIG. 6 is a graph of mode time constant as a function of degree of discharge of a battery unit in accordance with an example embodiment.

In the described embodiments, the initial values of the DUT model parameters account for variable conditions of a DUT, including degree of discharge, temperature, and age. FIG. 6 is a graph 600 of mode time constant (in seconds) as a function of degree of discharge (in decimal fractions) of a battery unit in accordance with an example embodiment. Depending on the degree of discharge, the resulting mode time constants vary over two order of magnitude. Referring again to the non-linear least squares algorithm 500, some DUT model parameters (e.g., mode circuit values) do not converge correctly when degree of discharge and temperature are not taken into account.

Figure 7:
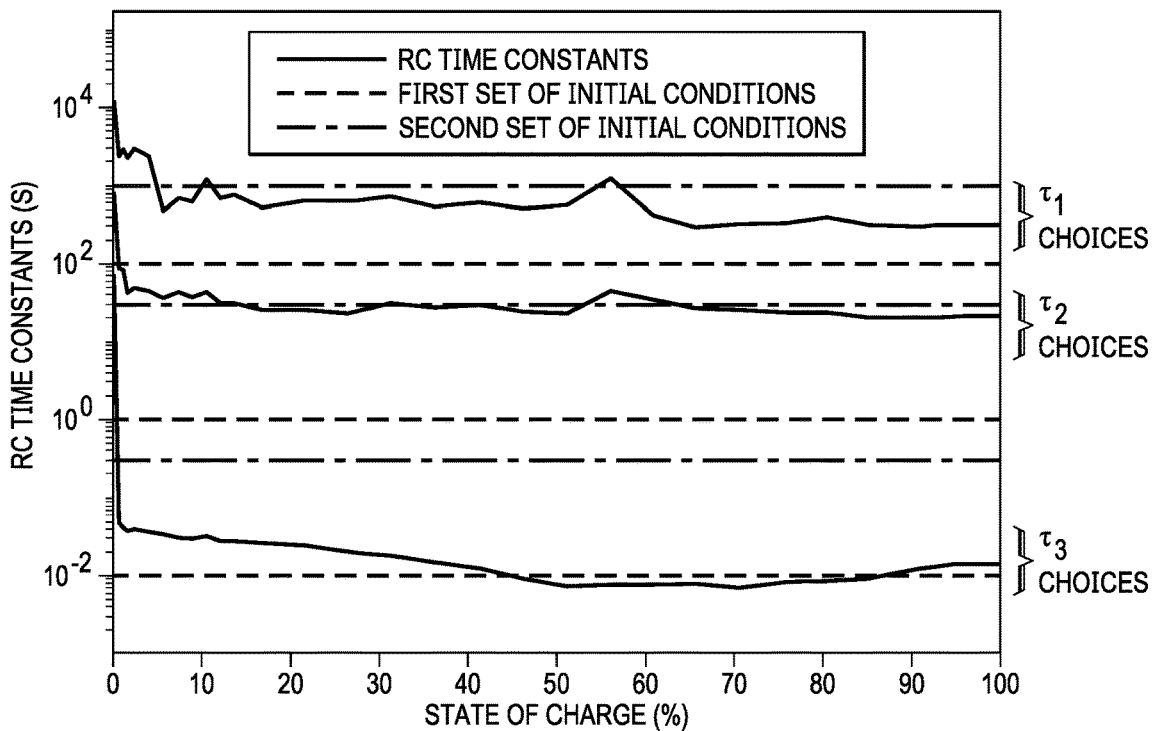
FIG. 7 is a graph of resistor-capacitor (RC) time constants as a function of state of charge of a battery unit in accordance with an example embodiment.

FIG. 7 is a graph 700 of resistor-capacitor (RC) time constants (in seconds) as a function of state of charge (in %)

of a battery unit in accordance with an example embodiment. In graph 700, RC constants ($\tau_1$, $\tau_2$, $\tau_3$) vary as a function of state of charge and different initial conditions. The initial values of the DUT model parameters may be based on a predetermined characterization of the DUT.

In some example embodiments, the predetermined characterization of the DUT includes initial values for DUT model parameters based on impedance spectrum measurements (e.g., determined from the obtained sense signals or related samples). In one example, the initial values include:

$$C_{s,init} = \max_{SOC,T} C_s(SOC, T), \quad \text{Equation (4)}$$

$$R_{s,init} = \text{Re}(Z_m(f_{max})), \quad \text{Equation (5)}$$

$$R_{p,init} = (R_{min} - R_{max})/N, \quad \text{Equation (6)}$$

$$\frac{\tau}{\min} = \frac{\gamma}{f_{max}}, \quad \text{Equation (7)}$$

$$\tau_{max} = \frac{1}{\gamma f_{min}} \quad \text{Equation (8)}$$

with
$\gamma = 2$, $$\tau_{p,init} = \kappa \tau_{min} e^{\left(\frac{p}{m} \ln\left(\frac{\tau_{max}}{\tau_{min}}\right)\right)} \quad \text{Equation (9)}$$

$p = 1, \cdots, M$,
and $$C_{p,init} = \tau_p / R_{p,init}. \quad \text{Equation (10)}$$

For Equation 4, $C_{s,init}$ is the initial value of $C_s$, $$\max_{SOC,T} C_s$$

is the maximum value for $C_s$, SOC is the state of charge, and T is temperature. For Equation 5, $R_{s,init}$ is the initial value of $R_s$, Re( ) is the real part of the argument, and $Z_m(f_{max})$ is the measured impedance for a maximum frequency. For Equation 6, $R_{p,init}$ is the initial value of $R_p$ is resistance value of the $p^{th}$ mode, $R_{min}$ is the minimum possible resistance value, and $R_{max}$ is the maximum possible resistance value. For Equation 7, $\tau_{min}$ is the minimum mode time constant, and $\gamma$ is a scale factor applied to the system frequency range. For Equation 8, $\tau_{max}$ is the maximum mode time constant, and $f_{min}$ is a minimum frequency. For Equation 9, $\tau_{p,init}$ is the initial value of $\tau_p$, $\kappa$ is a parameter used to select the initial starting condition, p is the mode number, and M is the total number of modes. For Equation 10, $C_{p,init}$ is the initial value of $C_p$. In some example embodiments, $\kappa$ enables mode time constant variance to account for different degree of discharge (DOD), temperature, and age conditions.

Figure 8:
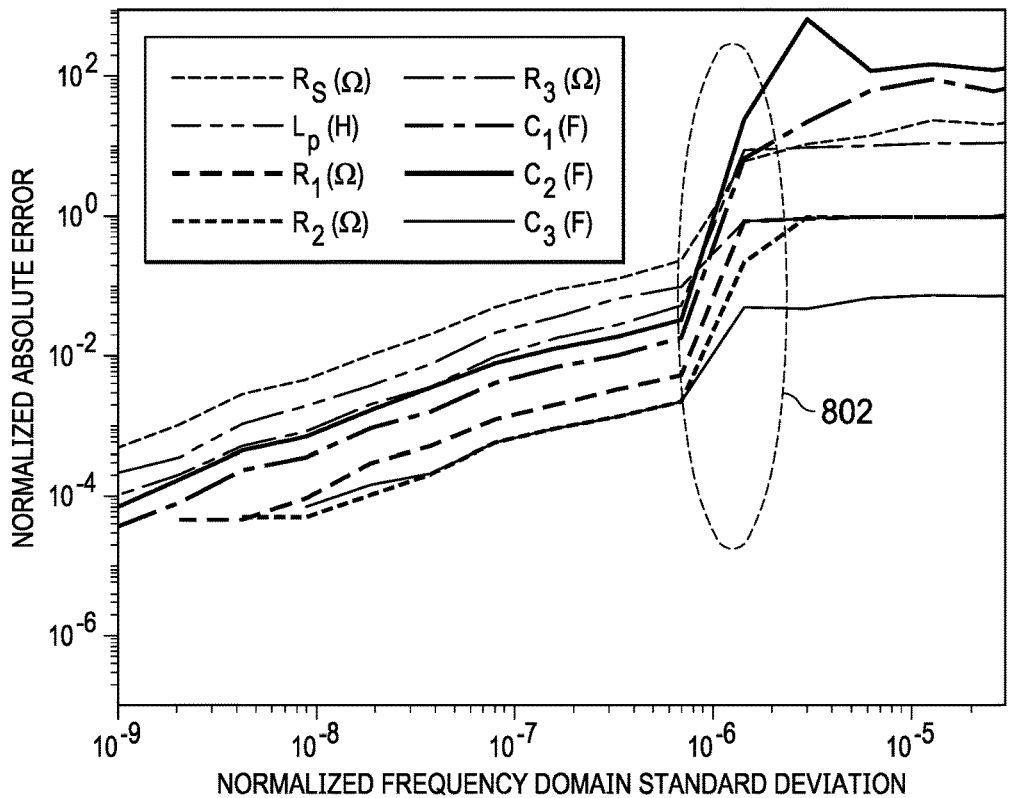
FIG. 8 is a graph of normalized absolute error as a function of normalized frequency domain standard deviation for DUT model parameters in accordance with a conventional technique.

FIG. 8 is a graph 800 of normalized absolute error as a function of normalized frequency domain standard deviation for DUT model parameters in accordance with a conventional technique (e.g., the non-linear least squares technique in FIG. 5). In graph 800, the DUT model parameters include: $R_s$; $L_p$; $R_1$; $R_2$; $R_3$; $C_1$, $C_2$; and $C_3$. Due to convergence to a false local minimum there is a large error increase 802 in the DUT model parameters.

Figure 9:
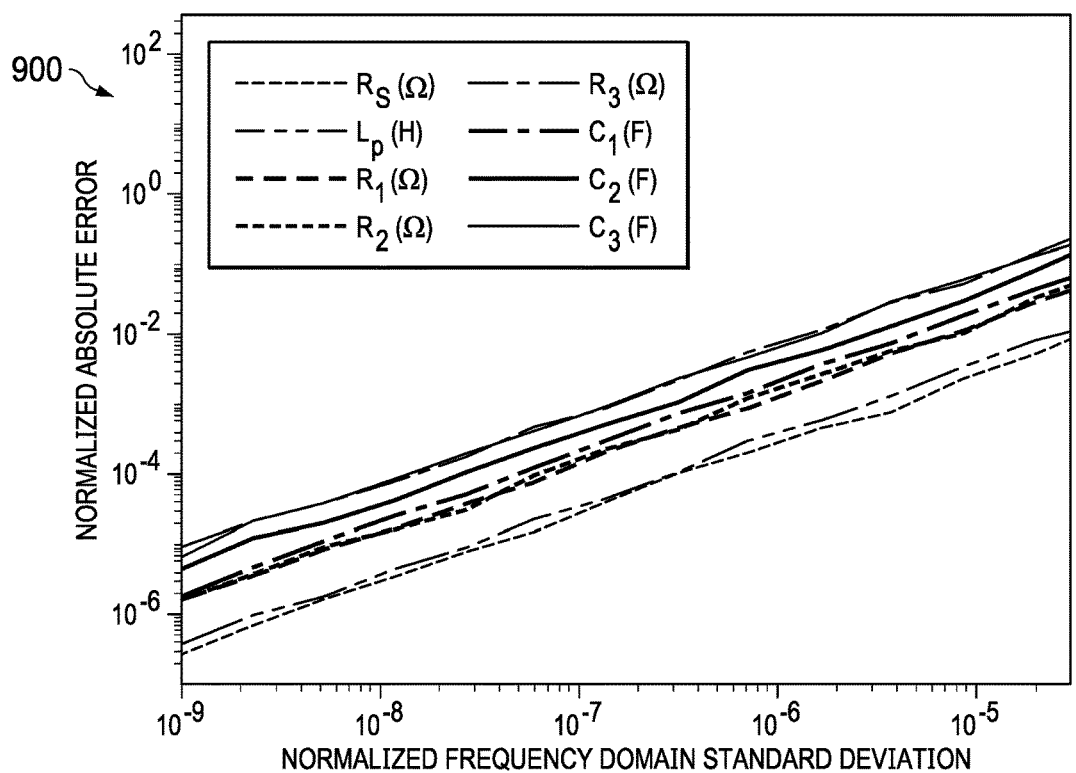
FIG. 9 is a graph of normalized absolute error as a function of normalized frequency domain standard deviation for DUT model parameters in accordance with an example embodiment.

FIG. 9 is a graph 900 of normalized absolute error as a function of normalized frequency domain standard deviation (i.e., the standard deviation of the noise added in the frequency domain) for DUT model parameters in accordance with an example embodiment. In graph 900, the DUT model parameters includes: $R_s$; $L_p$; $R_1$; $R_2$; $R_3$; $C_1$, $C_2$; and $C_3$. With the parameter convergence model described herein, false local minimums and related errors are avoided or reduced. Compared to the conventional technique, the parameter convergence model described herein provides improved accuracy (e.g., 100 times more accurate) and maintains estimation error linearity over the frequency range of interest (e.g., nonlinear discontinuities due to signal-to-noise ratio (SNR) and convergence to incorrect minima are avoided).

In some example embodiments, a parameter convergence model (e.g., the parameter convergence model 116 in FIG. 1) is given as:

$$(J^T J + \lambda I)\Delta\beta = J^T r^{(k)}, \quad \text{Equation (11)}$$

where J is a Jacobian matrix (i.e., the gradient of the model with respect to the unknown parameters), $J^T$ is the transpose of the Jacobian matrix, $\lambda$ is a regularization parameter, I is the identity matrix, $\Delta\beta$ is the change in $\beta$, and $r^{(k)}$ is the residual for the $k^{th}$ iteration of the model. With the parameter convergence model, the regularization parameter is adjustable. At the beginning of optimization, large values are used for the regularization parameter and the parameter convergence model behaves like a steepest descent algorithm. As fit quality improves, the regularization parameter is reduced to expedite convergence near the local optimum. Use large values at beginning of optimization to get behavior like steepest descent. As fit quality improves, reduce it to get fast convergence of near the local optimum.

In some example embodiments, a parameter convergence model (e.g., the parameter convergence model 116 in FIG. 1) uses a ratio of cost function improvement to expected improvement to update the regularization parameter. For example, the ratio may be given as:

$$\rho = \frac{\ell^2(r^{(k)}) - \ell^2(r^{(k+1)})}{\Delta\beta^T(\lambda^{(k)}\Delta\beta + J^T r)}, \quad \text{Equation (12)}$$

where $\ell^2(r^{(k)}) - \ell^2(r^{(k+1)})$ is the cost ratio improvement and $\Delta\beta^T(\lambda^{(k)}\Delta\beta + J^T r)$ is the expected improvement for the linearized model. In some example embodiments, $\rho$ is compared to an acceptance threshold $\epsilon$. If $\rho > \epsilon$, the regularization parameter is selected to be a maximum of a first value and a second value. The first value may be fixed while the second value is a function of the ratio. In some example embodiments, if $\rho > \epsilon$, $\lambda^{(k+1)} = \lambda^{(k)} \max[\frac{1}{3}, 1-(2\rho-1)^3]$. If the ratio is less than or equal to the threshold, the regularization parameter is increased for a next iteration of the parameter convergence model relative to its current value. In some example embodiments, if $\rho \leq \epsilon$, $\lambda^{(k)} = 2\lambda^{(k)}$. With the parameter convergence model, faster convergence to more accurate parameter estimates is achieved relative to the nonlinear least squares technique.

As shown in graph 700 of FIG. 7, a parameter convergence model (e.g., the parameter convergent model 116 in FIG. 1) is computed by a parameter estimator circuit (e.g., the parameter estimator circuit 110 in FIG. 1) for multiple values of the initial conditions. These different choices of the initial condition are parameterized by values of $\kappa$, as shown in Equation 9. For each starting point, the parameter convergence model will converge to a final value of the DUT model parameters. The DUT model parameters are a function of $\kappa$, and are denoted by the vector $\beta(\kappa)$. A parameter estimator circuit (e.g., the parameter estimator circuit 110)

circuit is configured to determine the best set of converged parameter estimates by comparison of the residual errors. In some example embodiments, the total residual error metric for an individual set of initial conditions is a function of κ, and is given by:

$$\ell^2(r,\beta(\kappa))=\Sigma_{a=1}^{N_f} r^2[a,\beta(\kappa)].\qquad\text{Equation (13)}$$

The final set of converged parameter estimates is associated by a parameter estimator circuit (e.g., the parameter estimator circuit 110 in FIG. 1) with the smallest total residual error metric, and is denoted as:

$$\beta_{final} = \operatorname*{argmin}_{\beta(\kappa)} \ell^2(r, \beta(\kappa)).\qquad\text{Equation (14)}$$

The parameters contained in the vector $\beta_{final}$ are provided by the parameter estimator circuit to an analyzer circuit (e.g., the analyzer circuit 118 in FIG. 1) for use in subsequent DUT management operations performed or triggered by the analyzer circuit 118.

Figure 10:
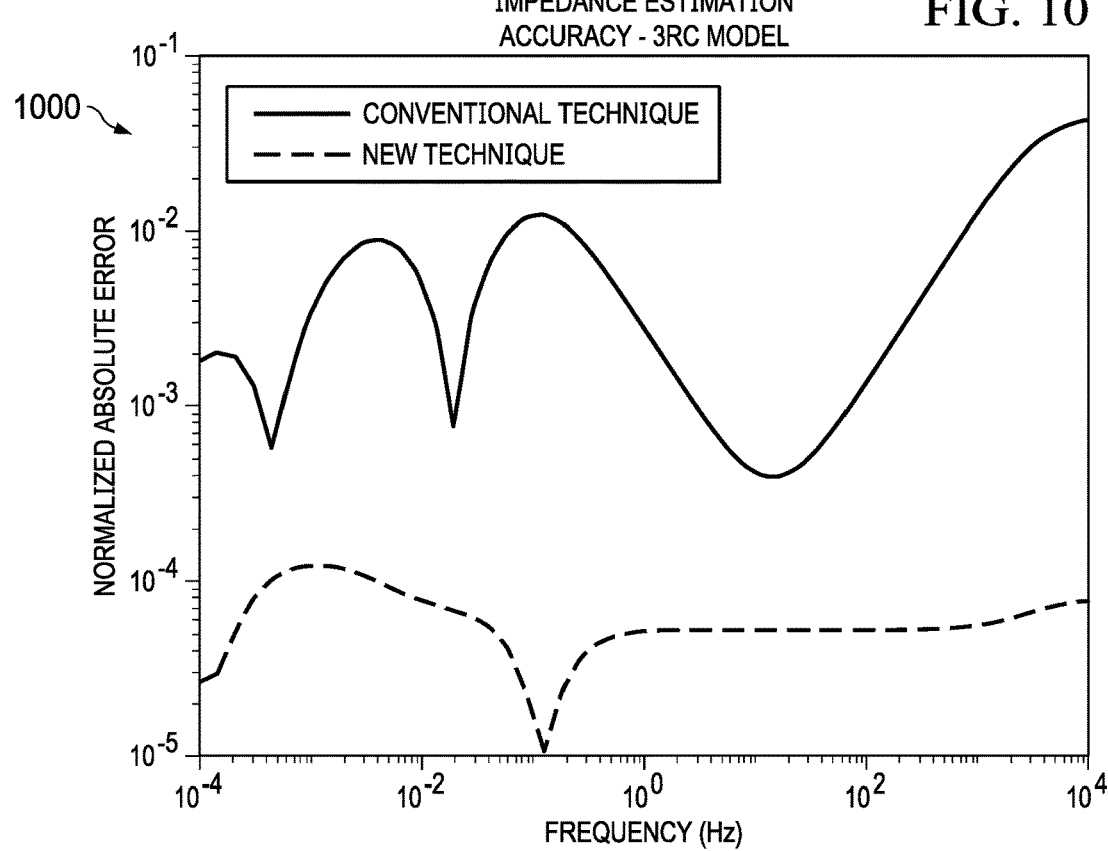
FIG. 10 is a graph of normalized absolute error as a function of frequency for a conventional DUT model parameter estimation technique and a new DUT model parameter estimation technique in accordance with an example embodiment.

FIG. 10 is a graph 1000 of normalized absolute error as a function of frequency for a conventional DUT model parameter estimation technique and a new DUT model parameter estimation technique in accordance with an example embodiment. In graph 1000, the parameter convergence model provides greater than 30× improvement in impedance accuracy at high frequency and 5× improvement in impedance accuracy at low frequency compared to the conventional technique. For a DUT model with additional mode circuits, impedance accuracy at low frequency improves.

Figure 11:
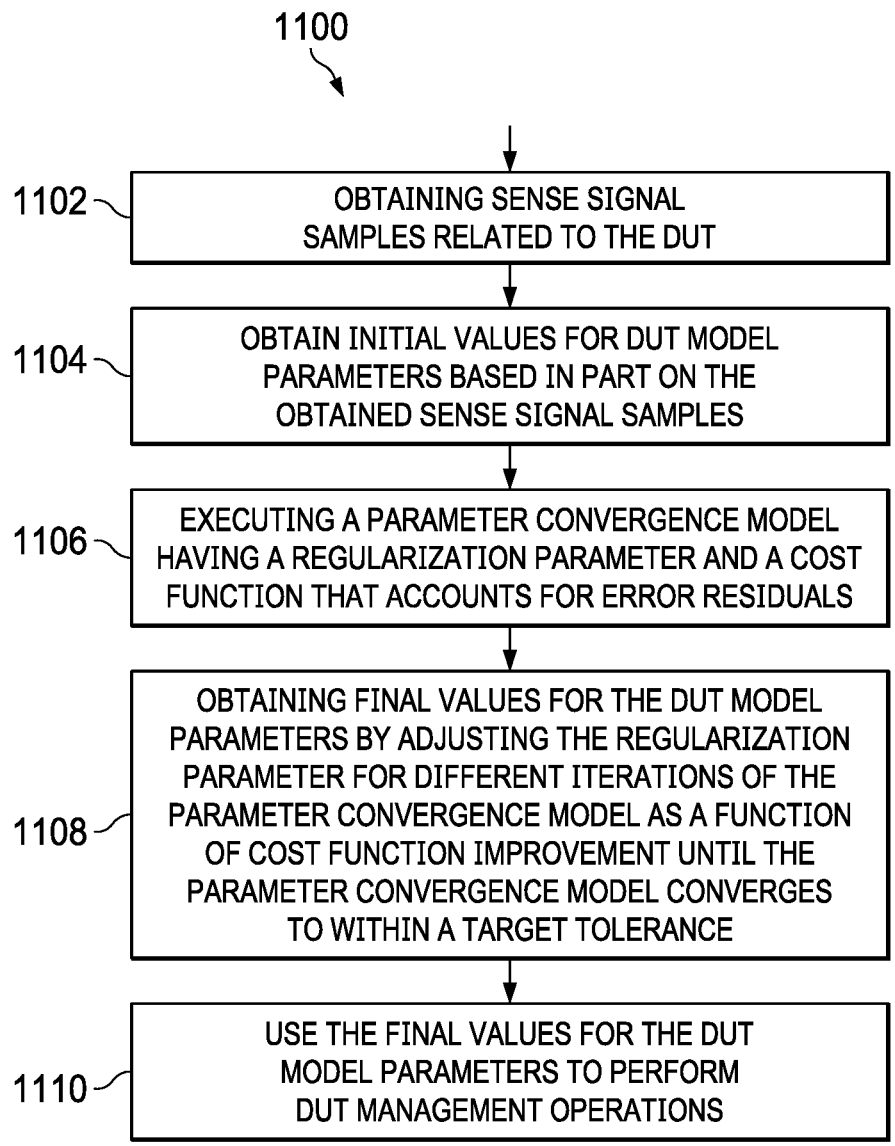
FIG. 11 is a flowchart of a DUT management method in accordance with an example embodiment.

FIG. 11 is a flowchart of a DUT management method 1100 in accordance with an example embodiment. The method 1100 is performed, for example, by a measurement circuit (e.g., the measurement circuit 104 in FIG. 1) or DUT management circuit (e.g., the DUT management circuit 102 in FIG. 1). At block 1102, sense signal samples related to the DUT are obtained. At block 1104, initial values for DUT model parameters are obtained based at least on the obtained sense signal samples. At block 1106, a parameter convergence model having a regularization parameter and a cost function that accounts for error residuals is executed. At block 1108, final values for the DUT model parameters are obtained by adjusting the regularization parameter in iterations of the parameter convergence model as a function of cost function improvement until the parameter convergence model converges to within a target tolerance. At block 1110, the final values for the DUT model parameters are used to perform DUT management operations.

In some example embodiments, the method 1100 includes: determining a ratio of cost function improvement to expected improvement; and comparing the ratio to a threshold. If the ratio is greater than the threshold, the regularization parameter for a next iteration of the parameter convergence model is selected to be a maximum of a first value and a second value. If the ratio is less than or equal to the threshold, the value of the regularization parameter for a next iteration of the parameter convergence model is increased relative to its current value. In some examples, the first value is fixed and the second value is a function of the ratio. Without limitation, the DUT model parameters may include: a series resistance, a series capacitance, a series inductance, mode capacitors, and mode resistors, and the method further comprises using initial values for the series resistance, the series capacitance, the series inductance, the mode capacitors, the mode resistors, and mode time constants based on a predetermined characterization of the DUT. In some example embodiments, the mode time constants vary to account for degree of discharge, temperature, and age of the DUT. In some example embodiments, the method 1100 includes running the parameter convergence model for multiple initial DUT model parameter settings based on a characterization of the DUT; and selecting final converged values for the DUT model parameters based on minimization of a total residual error metric. Also, the method 1100 may include: converting the obtained sense signal samples, including voltage sense signal samples and current sense signal samples, to frequency domain values; representing the frequency domain values as complex values; and using the complex values with the parameter convergence model. With the method 1100, the accuracy and convergence speed of solving for DUT model parameters is improved relative to conventional frequency domain estimation of DUT model parameters.

Some example embodiments include a measurement circuit for a DUT. The measurement circuit is configured perform frequency domain estimation of DUT model parameters. In some example embodiments, the measurement circuit is configured to: obtain sense signal samples related to the DUT (e.g., voltage across the DUT and/or current through the DUT); obtain initial values for the DUT model parameters based on the obtained sense signals; execute a parameter convergence model having a regularization parameter and a cost function that accounts for error residuals; and obtain final values for the DUT model parameters by adjusting the regularization parameter in iterations of the parameter convergence model as a function of cost function improvement until the parameter convergence model converges to within a target tolerance.

In some example embodiments, the regularization parameter is adjusted in iterations of the parameter convergence model as a function of a ratio of cost function improvement to expected improvement. For example, the ratio may be compared to a threshold. If the ratio is greater than the threshold, the regularization parameter is selected to be the maximum of a first value and a second value. Without limitation, the first value may be fixed and the second value may be a function of the ratio. If the ratio is less than or equal to the threshold, the regularization parameter is increased relative to its current value for a next iteration of the parameter convergence model.

The final values for the DUT model parameters may be provided by a parameter estimator circuit to an analyzer circuit configured to provide DUT management operations based on the DUT model parameters and possibly other parameters (e.g., temperature or other conditions). In some example embodiments, the DUT model parameters include: a series resistance, a series capacitance, a series inductance, mode capacitors, mode resistors, and mode time constants. In such case, the parameter estimator operations are based on initial values for the series resistance, the series capacitance, the series inductance, the mode capacitors, the mode resistors, and mode time constants obtained from a characterization of the DUT. The mode time constants vary to account for varying conditions of the DUT such as DOD, temperature condition, and age.

In some example embodiments, the DUT is a battery unit and the DUT model parameters are used to characterize battery unit impedance as a function of frequency. In different example embodiments, a battery unit refers to a battery cell or multiple battery cells (e.g., battery cells coupled in series and/or in parallel). The number of battery cells included in a battery unit may vary (e.g., 1 to 20 cells).

As desired, a number of battery units may be connected in series to form a battery module. Without limitation, a battery module may include from 10 to 40 battery units.

In some example embodiments, the battery unit impedance as a function of frequency as well as related parameters (e.g., temperature, SOC, SOH, and/or other parameters) may be used to provide the battery management operations. Example battery management operations include: charging operations (e.g., turn battery charging on/off); degree of discharge operations (e.g., adjust current flow to one or more loads); fault condition monitoring (e.g., disconnect or replace battery cells or groups of battery cells); and/or other battery-related operations. As desired, battery management operations are performed for a battery module, each battery unit of the battery module, and/or each battery cell of each battery unit. Suitable measurement circuit ICs and related sense circuity are used to perform sampling and parameter estimation operations as described herein for a battery module, each battery unit, or each battery cell. With the described parameter convergence model, the accuracy and convergence speed of DUT model parameters is improved relative to a conventional non-linear least squares algorithm, which improves the battery management operations.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

As used herein, the terms "electrode," "node," "interconnection," "pin," "contact," and "connection" are used interchangeably. Unless specifically stated to the contrary, these terms are generally used to mean an interconnection between or a terminus of a device element, a circuit element, an integrated circuit, a device or other electronics or semiconductor component.

The example embodiments above may utilize switches in the form of n-type or p-type metal-oxide semiconductor field-effect transistors ("NMOS" or "PMOS") transistors. Other example embodiments may utilize NPN bipolar junction transistors (BJTs), PNP BJTs, or any other type of transistor. Hence, when referring to a current electrode, such electrode may be an emitter, collector, source or drain. Also, the control electrode may be a base or a gate.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in this description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value.

Modifications are possible in the described embodiments, and other embodiments are possible, within the scope of the claims.

What is claimed is:

1. A circuit comprising:
   a driver circuit configured to provide a first signal to a battery;
   sense circuitry configured to provide a second signal by sensing a response of the battery to the first signal; and
   a parameter estimator circuit configured to:
      determine a measured impedance of the battery under a measurement condition based on the second signal;
      determine first values of multiple capacitance parameters, multiple resistance parameters, and mode time constants of an impedance model of the battery based on the measured impedance, in which the first values reflect the measurement condition of the battery, the capacitance parameters contribute to first real and imaginary components of the impedance model, and the resistance parameters contribute to second real and imaginary components of the impedance model, wherein the mode time constants correspond to at least one of: a degree of discharge of the battery, a temperature of the battery, or an age of the battery, and wherein the mode time constants are based on a starting condition parameter;
      start an iterative process of determining values of the capacitance parameters and resistance parameters by providing the first values to a parameter convergence model as initial values; and
      end the iterative process based on the parameter convergence model indicating that the values of the capacitance parameters and resistance parameters reaching a target tolerance, and provide the values at the end of the iterative process as final values of the capacitance parameters and resistance parameters.

2. The circuit of claim 1, wherein the parameter convergence model represents a relationship between adjustments to the first values and a difference between the measured impedance and an estimated impedance based on the impedance model including the values of the capacitance parameters and resistance parameters, the relationship including regularization parameters, and wherein the parameter estimator circuit is configured to, in the iterative process:
provide a first iteration of the values to the parameter convergence model to determine a first iteration of estimated impedance;
determine a first iteration of the difference between the measured impedance and the first iteration of the estimated impedance;
determine a first iteration of the adjustments to the first values based on a first iteration of the regularization parameters and the first iteration of the difference;
determine a second iteration of the values based on adjusting the first iteration of the first values based on the first iteration of the adjustments;
determine a second iteration of the difference based on the second iteration of the values and the parameter convergence model; and
determine a second iteration of the regularization parameters based on a ratio between (i) a first metric based on the first and second iterations of the difference; and (ii) a second metric based on the first iteration of the regularization parameters and the first iteration of the adjustments.

3. The circuit of claim 2, wherein the parameter estimator circuit is configured to, in the iterative process:
compare the ratio to a threshold; and
responsive to the ratio being greater than the threshold, determine the second iteration of the regularization parameters by multiplying the first iteration of the regularization parameters by a maximum of a first parameter value and a second parameter value.

4. The circuit of claim 3, wherein the first parameter value is a predetermined value and the second parameter value is based on the ratio.

5. The circuit of claim 2, wherein the parameter estimator circuit is configured to, in the iterative process:
compare the ratio to a threshold; and
responsive to the ratio being less than or equal to the threshold, determine the second iteration of the regularization parameters by multiplying the first iteration of the regularization parameters by a pre-determined value.

6. The circuit of claim 2, wherein the measured impedance is a measured impedance spectrum at multiple frequencies, the estimated impedance is an estimated impedance spectrum at the multiple frequencies, and the difference is based on a sum of square of differences between the estimated and measured impedance spectrums.

7. The circuit of claim 1, further comprising a frequency analyzer circuit configured to:
generate a frequency domain representation of the second signal; and
provide the frequency domain representation of the second signal to the parameter estimator circuit,
wherein the parameter estimator circuit is configured to determine a first impedance using the frequency domain representation of the second signal.

8. The circuit of claim 1, wherein the multiple resistance and capacitance parameters include at least one of: a series resistance, a series capacitance, mode capacitances, or mode resistances.

9. The circuit of claim 1, wherein the measurement condition includes at least one of: a degree of discharge (DOD), a temperature, or an age.

10. The circuit of claim 1, wherein the parameter estimator circuit is configured to adjust regularization parameters of the parameter convergence model in the iterative process.

11. A system comprising:
a driver circuit configured to provide a first signal to a battery, in which the battery is under a measurement condition;
sense circuitry configured to provide a second signal by sensing a response of the battery to the first signal;
a memory that stores a set of instructions; and
a processor configured to execute the set of instructions to:
determine a measured impedance of the battery based on the second signal;
determine first values of multiple capacitance parameters, multiple resistance parameters, and mode time constants of an impedance model of the battery based on the measured impedance, in which the first values reflect the measurement condition, the capacitance parameters contribute to first real and imaginary components of the impedance model, and the resistance parameters contribute to second real and imaginary components of the impedance model, wherein the mode time constants correspond to at least one of: a degree of discharge of the battery, a temperature of the battery, or an age of the battery, and wherein the mode time constants are based on a starting condition parameter;
start an iterative process of determining values of the capacitance parameters and resistance parameters by providing the first values to a parameter convergence model as initial values; and
end the iterative process based on the parameter convergence model indicating that the values of the capacitance parameters and resistance parameters reaching a target tolerance, and provide the values at the end of the iterative process as final values of the capacitance parameters and resistance parameters.

12. The system of claim 11, wherein the parameter convergence model represents a relationship between adjustments to the first values and a difference between the measured impedance and an estimated impedance based on the impedance model including the values of the capacitance parameters and resistance parameters, the relationship including regularization parameters, and wherein the processor is configured to, in the iterative process:
provide a first iteration of the values to the parameter convergence model to determine a first iteration of estimated impedance;
determine a first iteration of the difference between the measured impedance and the first iteration of the estimated impedance;
determine a first iteration of the adjustments to the first values based on a first iteration of the regularization parameters and the first iteration of the difference;
determine a second iteration of the values based on adjusting the first iteration of first values based on the first iteration of the adjustments;
determine a second iteration of the difference based on the second iteration of the values and the parameter convergence model; and
determine a second iteration of the regularization parameters based on a ratio between (i) a first metric based on the first and second iterations of the difference; and (ii) a second metric based on the first iteration of the regularization parameters and the first iteration of the adjustments.

13. The system of claim 12, wherein the processor is configured to, in the iterative process:
compare the ratio to a threshold;
responsive to the ratio being greater than the threshold, determine the second iteration of the regularization parameters by multiplying the first iteration of the regularization parameters by a maximum of a first parameter value and a second parameter value; and
responsive to the ratio being less than or equal to the threshold, determine the second iteration of the regularization parameters by multiplying the first iteration of the regularization parameters by a pre-determined value.

14. The system of claim 13, wherein the pre-determined value is a first pre-determined value, the first parameter value is a second pre-determined value and the second parameter value is based on the ratio.

15. The system of claim 11, wherein the processor is configured to:
generate a frequency domain representation of the second signal; and
determine a first impedance using the frequency domain representation of the second signal.

16. The system of claim 11, wherein the multiple resistance and capacitance parameters include at least one of: a series resistance, a series capacitance, a series inductance, mode capacitances, or mode resistances.

17. The system of claim 11, wherein the measurement condition includes at least one of: a degree of discharge (DOD), a temperature, or an age.

18. A method comprising:
providing, by a driver circuit, a first signal to a battery, in which the battery is under a measurement condition;
providing, by sense circuitry, a second signal by sensing a response of the battery to the first signal;
receiving, by a measurement circuit, the second signal;
determining, by the measurement circuit, a measured impedance of the battery based on the second signal;
determining, by the measurement circuit, first values of multiple capacitance parameters, multiple resistance parameters, and mode time constants of an impedance model of the battery based on the measured impedance, in which the first values reflect the measurement condition, the capacitance parameters contribute to first real and imaginary components of the impedance model, and the resistance parameters contribute to second real and imaginary components of the impedance model, wherein the mode time constants correspond to at least one of: a degree of discharge of the battery, a temperature of the battery, or an age of the battery, and wherein the mode time constants are based on a starting condition parameter;
starting, by the measurement circuit, an iterative process of determining values of the capacitance parameters and resistance parameters by providing the first values to a parameter convergence model as initial values; and
ending the iterative process based on the parameter convergence model indicating that the values of the capacitance parameters and resistance parameters reaching a target tolerance, and providing the values at the end of the iterative process as final values of the capacitance parameters and resistance parameters.

19. The method of claim 18, wherein the parameter convergence model represents a relationship between adjustments to the first values and a difference between the measured impedance and an estimated impedance based on the impedance model including the values of the capacitance parameters and resistance parameters, the relationship including regularization parameters, and wherein the iterative process includes:
providing a first iteration of the values to the parameter convergence model to determine a first iteration of estimated impedance;
determining a first iteration of the difference between the measured impedance and the first iteration of the estimated impedance;
determining a first iteration of the adjustments to the first values based on a first iteration of the regularization parameters and the first iteration of the difference;
determining a second iteration of the values based on adjusting the first iteration of the first values based on the first iteration of the adjustments;
determining a second iteration of the difference based on the second iteration of the values and the parameter convergence model;
determining a second iteration of the regularization parameters based on a ratio between (i) a first metric based on the first and second iterations of the difference; and (ii) a second metric based on the first iteration of the regularization parameters and the first iteration of the adjustments.

20. The method of claim 19, wherein the iterative process includes:
comparing, by the measurement circuit, the ratio to a threshold;
responsive to the ratio being greater than the threshold, determining the second iteration of the regularization parameters by multiplying the first iteration of the regularization parameters by a maximum of a first parameter value and a second parameter value for a subsequent iteration; and
responsive to the ratio being less than or equal to the threshold, determining the second iteration of the regularization parameters by multiplying the first iteration of the regularization parameters by a pre-determined value.

21. The method of claim 19, wherein the measured impedance is a measured impedance spectrum at multiple frequencies, the estimated impedance is an estimated impedance spectrum at the multiple frequencies, and the difference is based on a sum of square of differences between the measured and estimated impedance spectrums.

22. The method of claim 18, wherein the first values include at least one of: a series resistance, a series capacitance, a series inductance, mode capacitances, or mode resistances.

23. The method of claim 18, wherein the measurement condition includes at least one of: a degree of discharge (DOD), a temperature, or an age.

* * * * *